United States Patent
Tanase et al.

(10) Patent No.: US 9,040,970 B2
(45) Date of Patent: May 26, 2015

(54) HIDDEN ORGANIC OPTOELECTRONIC DEVICES

(71) Applicant: Koninklijke Philips N.V., Eindhoven (NL)

(72) Inventors: Cristina Tanase, Waalre (NL); Herbert Lifka, Eindhoven (NL); Mihaela Ioana Popovici, Leuven (BE); Horst Greiner, Aachen (DE)

(73) Assignee: Koninklijkle Philips N.V., Eindhoven (NL)

( * ) Notice: Subject to any disclaimer, the term of this patent is extended or adjusted under 35 U.S.C. 154(b) by 0 days.

(21) Appl. No.: 14/032,245

(22) Filed: Sep. 20, 2013

(65) Prior Publication Data

US 2014/0054573 A1    Feb. 27, 2014

Related U.S. Application Data

(63) Continuation of application No. 12/918,563, filed as application No. PCT/IB2009/050686 on Feb. 19, 2009, now Pat. No. 8,552,446.

(30) Foreign Application Priority Data

Feb. 27, 2008    (EP) ..................................... 08152016

(51) Int. Cl.
*H01L 35/24* (2006.01)
*H01L 51/00* (2006.01)
*H01L 51/44* (2006.01)
(Continued)

(52) U.S. Cl.
CPC ............... *H01L 51/448* (2013.01); *B82Y 20/00* (2013.01); *B82Y 30/00* (2013.01); *H01L 51/44* (2013.01); *H01L 51/5268* (2013.01); *H01L 2251/5369* (2013.01); *H01L 51/107* (2013.01)

(58) Field of Classification Search
USPC ................. 257/98, 99, E33.067; 438/22, 26; 313/503, 506
See application file for complete search history.

(56) References Cited

U.S. PATENT DOCUMENTS

| 4,456,647 A   | 6/1984 | Schonfelder et al. |
| 5,805,630 A * | 9/1998 | Valster et al. ............... 372/50.12 |

(Continued)

FOREIGN PATENT DOCUMENTS

| EP | 0858647    | 8/1998 |
| EP | 1435762 A1 | 7/2004 |

(Continued)

OTHER PUBLICATIONS

Soek et al: "TiO2 Nanoparticles Formed in Silica Sol-Gel Matrix"; Materials Chemistry and Physics, vol. 86, 2004, pp. 176-179.

*Primary Examiner* — Phuc Dang
(74) *Attorney, Agent, or Firm* — Meenakshy Chakravorty

(57) ABSTRACT

An optoelectronic device comprising at least one optoelectronic active region comprising at least a rear electrode and a front electrode between which an organic optoelectronic material is sandwiched, said rear electrode being reflective, and a cover layer arranged in front of said front electrode. The cover layer comprises a material with light-scattering particles of a first material dispersed in a transparent matrix of at an least partly hydrolyzed silica sol.
Due to the highly scattering propertied of the cover layer, the device is essentially concealed behind the cover layer when not in its operative state.

16 Claims, 1 Drawing Sheet

(51) Int. Cl.
  *B82Y 20/00* (2011.01)
  *B82Y 30/00* (2011.01)
  *H01L 51/52* (2006.01)
  *H01L 51/10* (2006.01)

(56) References Cited

U.S. PATENT DOCUMENTS

| | | | |
|---|---|---|---|
| 6,501,218 B1 | 12/2002 | Duggal et al. | |
| 7,791,271 B2 | 9/2010 | Cok et al. | |
| 7,834,539 B2* | 11/2010 | Handa et al. | 313/503 |
| 8,018,825 B2 | 9/2011 | Esaki et al. | |
| 8,125,128 B2* | 2/2012 | Funayama et al. | 313/116 |
| 2002/0003403 A1 | 1/2002 | Ghosh et al. | |
| 2003/0011315 A1* | 1/2003 | Ito et al. | 315/169.3 |
| 2006/0049745 A1* | 3/2006 | Handa et al. | 313/503 |
| 2006/0231844 A1* | 10/2006 | Carter | 257/79 |
| 2006/0290276 A1* | 12/2006 | Cok et al. | 313/512 |
| 2008/0210961 A1* | 9/2008 | Lin et al. | 257/98 |
| 2009/0011228 A1 | 1/2009 | Eveson et al. | |
| 2009/0302744 A1 | 12/2009 | Kim et al. | |
| 2010/0065861 A1* | 3/2010 | Nagai | 257/88 |
| 2010/0157585 A1* | 6/2010 | Diekmann et al. | 362/228 |

FOREIGN PATENT DOCUMENTS

| | | |
|---|---|---|
| EP | 1600688 A1 | 11/2005 |
| EP | 1860919 A1 | 11/2007 |
| JP | 5029641 A | 2/1993 |
| JP | 11297479 A | 10/1999 |
| WO | 2007035529 A2 | 3/2007 |
| WO | 2007107903 A1 | 9/2007 |

* cited by examiner

US 9,040,970 B2

HIDDEN ORGANIC OPTOELECTRONIC DEVICES

FIELD OF THE INVENTION

The present invention relates to an optoelectronic device comprising at least one optoelectronic active region that comprises at least a rear electrode and a front electrode between which an organic optoelectronic material is sandwiched, said rear electrode being reflective, and a cover layer arranged in front of said front electrode.

BACKGROUND OF THE INVENTION

OLED (organic light-emitting diode) and OPV (organic photovoltaics) technology is emerging as an alternative to different types of illumination/recharging purposes. Collectively, OLEDs and OPVs are referenced to as organic optoelectronic devices. In general, an organic optoelectronic device comprises two electrodes between which an organic optoelectronic material is sandwiched.

In an OLED, the optoelectronic material is an electroluminescent material. When a current is made to flow between the electrodes, the organic electroluminescent material emits light.

In an OPV device, the optoelectronic material is an organic photovoltaic material, which collects photons and transforms them into negative and positive charges so as to produce a voltage between the electrodes.

Due to the flexible nature of the organic optoelectronic devices, they may advantageously be used in flexible applications, i.e. applications where the device may be bent during normal operation, or on curved surfaces, for example providing a curved display device or illumination system in the case of an OLED.

In this context, a drawback of at least the current technology is that one of the anode and cathode electrodes that sandwich the optoetectronic material is highly reflective in order to obtain high light utilization. Hence, the devices have a mirror like appearance, which is not desired in some applications. For example, the appearance of the OLED in the OFF-state is important, and different solutions have been proposed in order to improve it.

U.S. Pat. No. 6,501,218 to Duggal et al. describes a device structure for outdoor signs OLED technology. Here, an OLED which is patterned into a sign, such as a character or a number, is combined with a highly scattering, non-absorbing coating over the light-emitting OLED regions and a highly absorbing coating over the non-emitting regions. The result is a sign that can be viewed by virtue of the OLED light under low ambient light level conditions thanks to the combination of the highly scattering material forming the sign (character, number) and the highly absorbing coating forming the outline of the sign.

U.S. Pat. No. 6,501,218 discloses the use of a scattering enamel coating on top of the OLED. However, the enamels need to be sprayed onto a plastic film or glass slide, which is then transferred to the OLED device. There is a demand for a coating that can be directly applied to the OLED surfaces without the need for intermediate coating steps.

The enamel coating of U.S. Pat. No. 6,501,218 has the further disadvantage that it will crack or flake off when the substrate onto which it has been sprayed is stressed or bent.

Also, there is a high interest in obtaining large surfaces containing luminous patterns for decorative and informative purposes, and it would be desirable in many cases if the patterns were visible only when the OLED surface emits light.

Furthermore, there is an interest in providing OPV devices which can be made invisible to a user, for example so as not to disturb the visual appearance of the device which is provided with a voltage from the OPV.

SUMMARY OF THE INVENTION

It is an object of the present invention to eliminate at least some of the problems of the prior art at least in part and to provide an improved organic optoelectronic device that is substantially concealed from a viewer unless it is in its operative state.

Thus, in a first aspect, the present invention provides an optoelectronic device comprising at least one optoelectronic active region, comprising at least a rear electrode and a front electrode between which an organic optoelectronic material is sandwiched, said rear electrode being reflective, and a cover layer arranged in front of said front electrode. Said cover layer comprises a material comprising light-scattering particles of a first material dispersed in a transparent matrix of at an least partly hydrolyzed silica sol.

The cover layer has a highly scattering characteristic due to the scattering particles. Hence, it has a high hiding power such that structures arranged beyond the cover layer are not visible. However, light can pass through the layer.

An at least partly hydrolyzed silica sol has a strong resistance to cracking under stress and can hence advantageously be used when the optoelectronic device is likely to be subjected to stresses.

An at least partly hydrolyzed sol can be conveniently obtained through drying of a prehydrolyzed silica sol, which can be done at room temperature. This cover layer material can be obtained without solvents and/or high temperatures that would otherwise have a negative impact on the OLED function. Furthermore, it is essentially non-absorbing, and the inclusion of scattering particles makes the cover layer highly scattering.

In embodiments of the present invention, the optoelectronic material may be an electroluminescent material.

If the optoelectronic material is an electroluminescent material, the optoelectronic device of the present invention is an OLED (organic light-emitting diode) device. The OLED emits light through the cover layer into the surroundings.

The light emitted by the OLED is received by the cover layer, and a portion (T) of this light is transmitted through the cover layer. Another portion of the light (1−T) is reflected back towards the OLED. This portion of this light (R(1−T)), where R is the reflectivity of the reflective electrode, is once more received by the cover layer after reflection in the reflective electrode of the OLED. A portion of this, secondary, light T(1−T)R is transmitted through the cover layer, whereas another portion T(1−T)²R is reflected back towards the OLED. This continues until there is no light left to be transmitted through the cover layer. As a result, the portion of the light emitted by the OLED and transmitted through the cover layer is significantly higher than would be expected on the basis of the transmissivity of the cover layer. Thus, in operation, the light emitted by the OLED is clearly visible through the cover layer. In the non-operative state, however, the OLED structure will be essentially invisible through the cover layer.

In other embodiments of the present invention, the organic optoelectronic material may be an organic photovoltaic material.

If the optoelectronic material is an organic photovoltaic material, the device of the present invention is an OPV (organic photo voltaic device), capable of transforming light into an electrical voltage.

Arranging an OPV behind a cover layer in accordance to the present invention renders the structures of the OPV invisible to the viewer, so that they can be hidden in different devices in which such an OPV is required. The OPV works well with diffused light, so the scattering characteristics of the cover layer do not hamper the function of the OPV.

It is noted that a device according to the present invention may comprise both an organic electroluminescent material and an organic photovoltaic material, for example one domain of the device acting as an organically based light-emitting device and another domain of the device acting as an organically based solar cell.

In embodiments of the present invention, said cover layer is superimposed on said at least one optoelectronic active region and covers at least the entire surface of said at least one optoelectronic active area.

Covering the entire optoelectronic surface with the cover layer hides the optoelectronic device, i.e. makes it essentially invisible to a viewer. In an OLED device, it may remain concealed until the device is in its operative state.

In embodiments of the present invention, the device may comprise at least a first and a second optoelectronic active area, which areas are arranged side by side and are mutually spaced apart so as to form an interstitial region there between, wherein said cover layer is superimposed on said first and second optoelectronic active regions and covers at least the combined surface of said first and second optoelectronic active regions and said interstitial region.

Covering of two or more OLEDs as well as the interstices between the OLEDs with one and the same cover layer provides a light pattern that can be displayed on the surface of the cover layer even though, as discussed above, the light-emitting device is concealed until in its operative state. In the case of a photovoltaic device, the surface of the cover layer will not reveal the presence of a plurality of devices arranged behind it.

In embodiments of the present invention, said transparent matrix is a silica sol-gel.

A sol-gel may be obtained by further drying of a partly hydrolyzed silica sol. This can be done at room temperature, or at least at temperatures that do not damage the optoelectronic components, and also without the use of chemical compounds such as solvents, which are detrimental to the optoelectronic components. A silica sol-gel is further a glass-like material which has a good resistance to mechanical influences, such as scratching.

In embodiments of the present invention, said cover layer may have a reflectivity in the range of from 50 to 95%.

Preferably, the reflectivity of the cover layer is within said range in order to maintain the compromise between the ability to hide the structure of the optoelectronic device(s) and the ability to emit sufficient light. In the case of an OLED device, the OLED is hidden in the non-operating state, while the cover layer allows light emitted by the OLED(s) to pass through.

In embodiments of the present invention, the refractive index of said particles of said first material is higher than the refractive index of the transparent matrix.

A good scattering effect is obtained by dispersing particles of high refractive index in a material of low refractive index.

In embodiments of the present invention, said particles of said first material account for about 10 to about 80% by weight of said cover layer material, preferably 15 to 70% by weight.

The light-scattering particles are contained in the cover layer at the above concentration in order to give the cover layer a good scattering effect.

In a second aspect, the present invention relates to an arrangement comprising a device of the first aspect of the invention arranged in a frame, at least partly surrounding the lateral edges of said device, wherein said cover layer covers said at least one device and at least part of said frame.

Covering of both the optoelectronic device(s) and the frame around it with the same cover material renders it possible for the optoelectronic device to be effectively hidden, since the transition from the frame to the OLED will not be easily detected from the outside by a mere visual inspection in the non-operating state (of an OLED).

In a third aspect, the present invention relates to a method for the manufacture of an optoelectronic device according to the invention, comprising the steps of providing an optoelectronic device; providing an optionally prehydrolyzed silica sol with particles of said first material dispersed therein; arranging a layer of said silica sol in front of said front electrode of said optoelectronic device; and drying said layer.

It is further noted that the invention relates to all possible combinations of the appended claims.

BRIEF DESCRIPTION OF THE DRAWINGS

These and other aspects of the present invention will now be described in more detail, with reference to the appended drawings showing a currently preferred embodiment of the invention.

DETAILED DESCRIPTION

The present invention relates to an organic optoelectronic device comprising a pair of electrodes, a rear and a front one between which an organic optoelectronic material is sandwiched, the rear electrode being reflective, while a cover layer is arranged in front of the front electrode.

Figure 1:
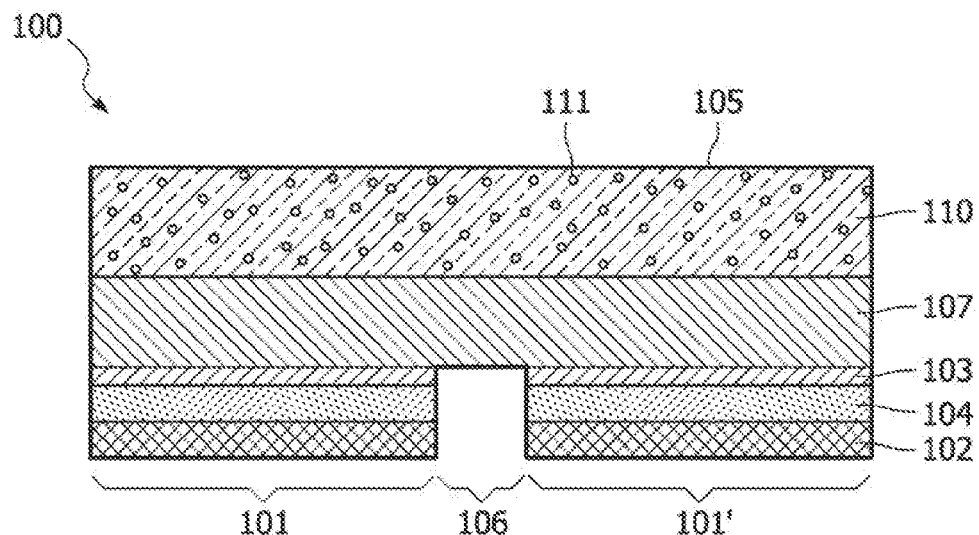
FIG. 1 schematically illustrates a light-emitting device of the present invention in a cross-sectional view.

A light-emitting device 100, i.e. an organic optoelectronic device wherein the organic optoelectronic material is an electroluminescent material according to the present invention, is schematically illustrated in FIG. 1 and comprises two OLED active regions 101 and 101'. Each OLED active region 101, 101' comprises an organic electroluminescent material 104 arranged, i.e. sandwiched, between a rear electrode 102 and a front electrode 103. An OLED active region 101 is defined as a region in which the electroluminescent material 104 is sandwiched between the two electrodes 102, 103. Regions between adjacent OLED active regions 101, 101' are denoted interstitial regions 106 hereinafter.

As used herein, the term "arranged in front of" in the context of the cover layer being arranged in front of the front electrode, means that the cover layer is arranged between the front electrode of the device and the external surroundings of the device. For an OLED device this means that the cover layer receives light emitted by the OLED and passes this on to the surroundings. For an OPV device, this means that ambient light passes through the cover layer before it passes through the front electrode and reaches the photovoltaic layer.

In the embodiment of FIG. 1, the front electrode 103 is transparent, so that it represents the light-emitting (front) side of the OLED device, whereas the rear electrode 102 is reflective.

Materials suitable for the electrodes and the organic electroluminescent or organic photovoltaic material will be known to those skilled in the art and will not be discussed in detail here. Typically, though, the transmissive front electrode may made of a transparent electrically conducting material such as ITO (indium-tin oxide), and the reflective rear electrode may be made of a reflective electrically conducting material such as a metal or a metal-coated material.

The organic optoelectronic material may be a polymeric material or a material with small organic molecules, as is commonly known in the art.

As is known in the art, an optoelectronic device may further conventionally comprise additional layers, such as barrier layers, metal shunts for uniform current distribution, buffer layers, and substrates. For the sake of simplicity, however, the description of such layers is omitted as their location and use are well known to those skilled in the art. An optoelectronic device, such as the light-emitting device 100 further typically comprises driving electronics (not shown), conventional in the art.

A cover layer 105 is arranged on top of the OILED active regions 101, 101', in front of the front electrode 103, and also covers the interstitial region 106 located between these active regions.

The cover layer 105 is arranged on a substrate 107 located between the front electrode and the cover layer 105. The substrate may, for example, be of glass or plastics and may, for example, comprise buffer layers protecting the active layers from water and/or oxygen.

The cover layer comprises an essentially non-absorbing matrix 111 of an at least partly hydrolyzed silica sol-gel in which scattering particles 110 are dispersed.

Typically, the matrix 111 is a silica sol-gel, which has the advantages of being a transparent, hard, scratch-resistant and glass-like material.

The scattering particles 110 are typically of a material having a refractive index higher than that of the surrounding matrix 111. For example, the refractive index of the scattering particles is preferably at least 2.0. The surrounding matrix typically has a refractive index of about 1.3 to 1.6.

The scattering particles 110 are typically made of a material selected from the group consisting of $TiO_2$ anastase, $TiO_2$ rutile, $ZrO_2$, $Ta_2O_5$, ZnS, ZnSe, or mixtures of two or more thereof.

These materials are good examples of materials suitable for essentially non-absorbing, scattering particles to be dispersed in said matrix.

The scattering particles typically account for about 10 to about 80% by weight of said cover layer material, preferably 15 to 70% by weight.

The light-scattering particles are contained in the cover layer in a concentration within the range given above so as to provide a good scattering effect in he cover layer.

The particle size of the scattering particles 110 can be selected to match the color of light emitted by the OLED so as to obtain a maximum scattering effect. The mean particle size should be close to the wavelength of the emitted light for this. Hence, the mean particle size of the scattering particles ranges of from 100 to 1000 nm, preferably 200 to 800 nm (i.e. the wavelength range from UV to visible light.)

The concentration of scattering particles 110 in the matrix and the thickness of the cover layer 105 are typically chosen so as to obtain a coating which conceals the OLED structures when the OLED active regions are in a non-operating (OFF) state, but which allows light emitted by the OLED active regions to shine through the cover layer 105.

Typically, a coating layer having a reflectivity of above 50% per pass is desired, preferably above 75%, such as above 85%, whereby a good hiding power is obtained.

The thickness of the cover layer is typically from 1 µm to 50 µm in order to provide a good hiding property and desired transmissivity.

In an ideal case, assuming a non-absorbing cover layer, the total transmission of light emitted by the OLED through the cover layer can be calculated as $$T_{tot} = \sum_{n=0}^{\infty} T((1-T)R)^n$$

where t is the transmission per pass through the cover layer (1−the reflectivity) and R is the reflectivity of the reflective electrode of the OLED active region.

For a value of T of 20% (80% reflection) and R of 80%, which are representative values of devices of the present invention, $T_{tot}$ equals 0.6.

Hence, the light emitted by the OLED active regions will be clearly visible through the cover layer, while the OLED structures will be substantially invisible through the cover layer in the OFF-state. The cover layer 105 may be obtained, for example, as follows.

A silica precursor sol-gel is obtained by prehydrolyzing an alkoxysilane solution in water, for example with an acid acting as a catalyst.

A suspension of silica particles is added to the prehydrolyzed sol. Then the scattering particles 110 are added to the mixture.

The resulting mixture can than be homogenized by means known to those skilled in the art, such as a roller bench. The result is a stable suspension. If kept in a freezer, the suspension has a shelf life of at least two months.

The suspension may then be coated onto the OLED surface by means of any conventionally used coating method, such as e.g. spin coating, spray coating or doctor blade coating.

The coated layer is allowed to dry in room temperature, no further heat treatment being needed to obtain a hard protective cover layer with the desired compromise between transmission and hiding properties.

The OLEDs used may be a uniform tile or may have a patterned picture or other atmosphere-creating design that is visible before coating.

It will be apparent to those skilled in the art that the embodiments described above may also be applied in an organic photovoltaic device (OPV) if the organic electroluminescent material is replaced by an organic photovoltaic material.

Typically, the OPV (also known as organic solar cell) is used for driving an electronic device of some kind (e.g. an OLED) by converting light, such as sunlight or indoor light, into electrical energy. An OPV of the present invention, which is concealed from a viewer, is advantageous in many applications, for example where it is desired that the OPV should not interfere with the visual appearance of the device to which the OPV provides a voltage. Since the OPVs are not visible anymore, the applicability of this method from a design point of view is enhanced. Examples of such applications include, but are not limited to, a solar-cell-driven watch, PDA, mobile phone, etc., where the OPV acts as the solar cell.

For the function of an OPV, the light utilized may very well be scattered, as this does not affect the light conversion efficacy of the device much. Hence, the OPV may advantageously be located behind a cover layer, as in the present invention.

However, if the optoelectronic device of the present invention is an OPV, the transmissivity of the cover layer is preferably not as restricted as described above in the OLED embodiment. Instead, the cover layer is typically selected to have a transmissivity of at least 20% per pass (a reflection of below 80% per pass), such as at least 50% per pass. However, the cover layer is typically selected on as to have good hiding characteristics, i.e. to be highly scattering.

The device of the present invention may be embedded in a surface, at least partly surrounded by a frame of the surface material, where both the device and the frame material are coated by the same cover layer material. Hence, the location of he device will be concealed from a viewer (in the case of an OLED device, at least until the device is in its ON-state and emits light). This may be used in a multitude of applications, as required, for quickly presenting information, a warning sign, or an artistic pattern on a wall.

Figures 2A, 2B:
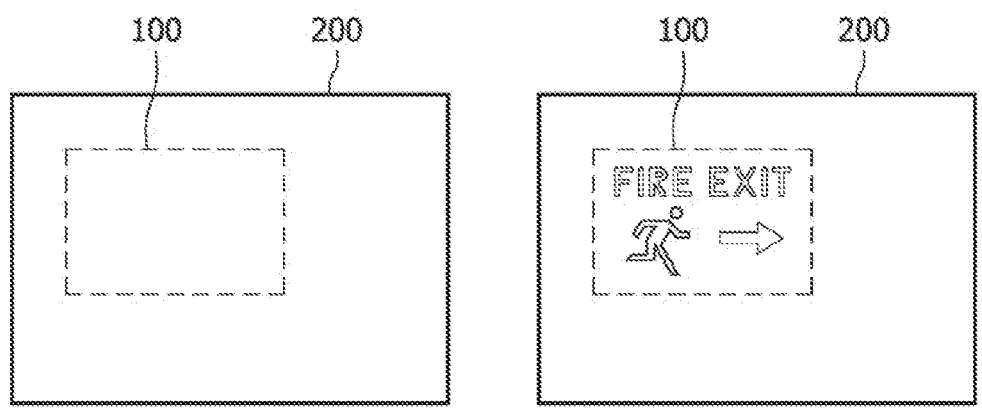
FIG. 2a schematically illustrates an OLED-based arrangement of the present invention in OFF-state in plan view.
FIG. 2b schematically illustrates the arrangement of FIG. 2a in ON-state in plan view.

Such an arrangement, comprising a light-emitting device 100 of the present invention embedded in an ordinary wall 200, is illustrated in FIGS. 2a and 2b. In FIG. 2a the light-emitting device is in the OFF-state, and the dashed tines only indicate the location of the light-emitting device 100. A opening is cut in the wall 200 to form a frame within which the light-emitting device 100 is arranged. The cover layer 105 is used not only to coat the light-emitting device 100 but also to coat the wall 200.

In FIG. 2b, the text "FIRE EXIT" and an arrow pointing in the desired direction is lit on the wall when the light-emitting device 100 is ON. This obviously represents only one possible use of an arrangement of a light-emitting device arranged in a frame of surrounding material.

The cover layer material based on a silica sol-gel as used in the present invention does not only adhere to OLED surfaces, but also to other surfaces such as, but not limited to, glass, metal, ceramic, plastic, or wooden surfaces. Hence, the light-emitting device of the present invention can be arranged in a frame of virtually any material. As OLED light-emitting devices can be made in flexible/bendable embodiments, the light-emitting devices of the present invention may be arranged in curved surfaces, such as a pillar, or the like.

Those skilled in the art will realize that such an arrangement of an optoelectronic device partly surrounded by frame, where both the device and the frame material are coated by the same cover layer material, is also applicable to an OPV device.

In the embodiments described above, the cover layer covers more than the active regions of the optoelectronic devices. In other embodiments of the invention (not shown), however, the cover layer only, or essentially only covers the active region(s), such that the shape or patters of the active region(s) is clearly visible even though the actual layer structure of the optoelectronic device is concealed by the cover layer. For example, the cover layer may be made clearly visible through the introduction of a dye or pigment.

Those skilled in the art will realize that the present invention is by no means limited to the preferred embodiments described above. On the contrary, many modifications and variations are possible within the scope of the appended claims.

For example, the cover layer material may contain a pigment or dye to give the cover layer a desired color.

The invention claimed is:

1. An optoelectronic device comprising:
a first and a second optoelectronic active region, each region comprising at least a rear electrode and a front electrode between which an organic optoelectronic material is sandwiched, said rear electrode being reflective, wherein the first and second optoelectronic active regions are arranged side by side and are mutually spaced apart so as to form an interstitial region between them; and
a cover layer arranged in front of and superimposed on said front electrode of the first and second optoelectronic active regions, said cover layer comprising a material that comprises light-scattering particles of a first material dispersed in a transparent matrix comprised of an at least partly hydrolyzed silica sol, wherein said cover layer covers at least the combined surface of said first and second optoelectronic active regions and said interstitial region.

2. A device according to claim 1, wherein said organic optoelectronic material is an electroluminescent material.

3. A device according to claim 1, wherein said organic optoelectronic material is an organic photovoltaic material.

4. A device according to claim 1, wherein said cover layer is superimposed on said at least one first and second optoelectronic active region regions and covers at least the entire surface of said at least one first and second optoelectronic active regions area.

5. A device according to claim 1, wherein said transparent matrix is a silica sol-gel.

6. A device according to claim 5, wherein said cover layer has a reflectivity in a range of 50 to 95%.

7. A device according to claim 6, wherein the refractive index of said particles of said first material is higher than the refractive index of the transparent matrix.

8. A device according to claim 7, wherein the refractive index of said particles of said first material is at least 2.0.

9. A device according to claim 8, wherein said first material is selected from the group consisting of TiO2 anastase, TiO2 rutile, ZrO2, Ta2O5, ZnSe, ZnS, and mixtures of two or more thereof.

10. A device according to claim 5, wherein said particles account for about 10 to about 80% by weight of said cover layer material.

11. A device according to claim 5, wherein the mean particle size of said particles of the first material lies in a range of 100 to 1000 nm.

12. A device according to claim 11, wherein said transparent matrix comprises a color dye.

13. An arrangement comprising a device according to claim 12 arranged in a frame, which frame at least partly surrounds the lateral edges of said device, wherein said cover layer covers said at least one light-emitting device first and second optoelectronic active regions and at least part of said frame.

14. A method for the manufacture of a device according to claim 5, comprising the steps of:
providing an optoelectronic device;
providing an optionally prehydrolyzed silica sol with particles of said first material dispersed therein;
arranging a layer of said silica sol in front of said front electrode of said optoelectronic device; and
drying said layer.

15. An optoelectronic device arranged in a frame, which frame at least partly surrounds the lateral edges of said device, comprising:
- at least one optoelectronic active region comprising at least a rear electrode and a front electrode between which an organic optoelectronic material is sandwiched, said rear electrode being reflective; and
- a cover layer arranged in front of said front electrode, said cover layer comprising a material that comprises light-scattering particles of a first material dispersed in a transparent matrix comprised of an at least partly hydrolyzed silica sol, wherein said cover layer covers said at least one optoelectronic active regions and at least part of said frame.

16. A method for the manufacture of a device, comprising the steps of:
- providing an optoelectronic device comprising at least one optoelectronic active region that has at least a rear electrode and a front electrode between which an organic optoelectronic material is sandwiched, said rear electrode being reflective;
- providing an optionally prehydrolyzed silica sol with light-scattering particles of a first material dispersed therein;
- arranging a layer of said silica sol in front of the front electrode of said optoelectronic device; and
- drying said layer.

* * * * *